United States Patent
Shin

(10) Patent No.: US 7,329,848 B2
(45) Date of Patent: Feb. 12, 2008

(54) PHOTO SENSOR, DISPLAY PANEL HAVING THE SAME AND DISPLAY DEVICE HAVING THE DISPLAY PANEL

(75) Inventor: Kyoung-Ju Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 11/190,139

(22) Filed: Jul. 26, 2005

(65) Prior Publication Data

US 2006/0124828 A1 Jun. 15, 2006

(30) Foreign Application Priority Data

Dec. 10, 2004 (KR) .................. 10-2004-0104219

(51) Int. Cl.
*H03K 17/78* (2006.01)
(52) U.S. Cl. .................. 250/214 SW; 250/214.1; 257/229; 257/294
(58) Field of Classification Search ............. 250/214.1, 250/214 SW, 239; 257/229, 294
See application file for complete search history.

(56) References Cited

U.S. PATENT DOCUMENTS

| | | | | |
|---|---|---|---|---|
| 5,306,926 A | * | 4/1994 | Yonemoto | .................. 257/432 |
| 5,557,121 A | * | 9/1996 | Kozuka et al. | ............. 257/292 |
| 2002/0063199 A1 | * | 5/2002 | Kozuka | .................. 250/214.1 |
| 2002/0166951 A1 | * | 11/2002 | Cazaux | .................... 250/214.1 |

* cited by examiner

*Primary Examiner*—Georgia Epps
*Assistant Examiner*—Stephen Yam
(74) *Attorney, Agent, or Firm*—Cantor Colburn LLP

(57) ABSTRACT

A photo sensor includes a first substrate, a switching element and a second substrate. The switching element is disposed at the first substrate and defined by a control electrode, and first and second current electrodes. The switching element includes a channel disposed between the first and second current electrodes. The channel has a first length to receive an incident external light. The second substrate includes a light receiving unit that is disposed corresponding to the channel. The light receiving unit has a second length longer than the first length and shorter than a third length of the control electrode.

16 Claims, 12 Drawing Sheets

PHOTO SENSOR, DISPLAY PANEL HAVING THE SAME AND DISPLAY DEVICE HAVING THE DISPLAY PANEL

This application claims priority to Korean Patent Application No. 2004-104219, filed on Dec. 10, 2004, and all the benefits accruing therefrom under 35 U.S.C § 119, and the contents of which in its entirety are herein incorporated by reference.

BACKGROUND OF THE INVENTION

1. Field of the Invention

The present invention relates to a photo sensor, a display panel having the same and the display device having the display panel.

2. Description of the Related Art

Generally, a liquid crystal display device is classified as either a transmissive type liquid crystal display device, which displays images using an internal light source such as a backlight assembly, or a transmissive and reflective type liquid crystal display device which displays images using the internal light source or by reflecting an external incident light.

The transmissive and reflective type display device controls power supplied to a backlight assembly in response to an intensity of the external incident light. Specifically, when the external incident light has a lower intensity, the transmissive and reflective type display device operates in a transmission mode such that the backlight assembly is turned on and internal light transmitted by the backlight assembly is used to display images. When the external incident light has a higher intensity, the transmissive and reflective type display device operates in a reflective mode such that the backlight assembly is turned off and the external incident light is reflected to display images. Additionally, a gamma level is automatically adjusted corresponding to either the transmission mode or the reflective mode so that an image displaying quality is improved.

Thus, power consumption of the transmissive and reflective type display device is reduced by controlling a power supplied to the backlight assembly in response to the intensity of the external incident light. Additionally, when the gamma level is adjusted according to a respective operational mode of the liquid crystal display device, the image displaying quality is improved. Accordingly, a photo sensor disposed on a display panel of the liquid crystal display device to sense the intensity of the external incident light is required to reduce the power consumption of the liquid crystal display device.

SUMMARY OF THE INVENTION

Accordingly, the present invention is provided to substantially obviate one or more problems due to limitations and disadvantages of the related art. Exemplary embodiments of the present invention provide a photo sensor having improved reliability.

In an exemplary embodiment of the present invention, a photo sensor includes a first substrate, a switching element and a second substrate. The switching element is disposed at the first substrate and defined by a control electrode, and first and second current electrodes. The switching element includes a channel disposed between the first and second current electrodes. The channel has a first length to receive an incident external light. A light receiving unit is disposed at the second substrate corresponding to the channel. The light receiving unit has a second length longer than the first length and shorter than a third length of the control electrode.

The second length of the light receiving unit includes a margin to account for misalignment between the first and second substrates. Particularly, the second length of the light receiving unit extends beyond both ends of the channel in a direction substantially perpendicular to a longitudinal direction of the first and second current electrodes by a first margin.

Exemplary embodiments of the present invention also provide a display panel having the above photo sensor. In some exemplary embodiments of the present invention, the display panel includes an array substrate, a liquid crystal layer and an opposing substrate. The array substrate has an active area on which a first switching element is disposed and a sensing area on which a second switching elements is disposed. The second switching element has a channel of a first length. The opposing substrate is combined with the array substrate to receive the liquid crystal layer and includes sensor windows corresponding to the sensing area. The sensor window has a second length longer than the first length and shorter than a third length of a control electrode of the second switching element.

Exemplary embodiments of the present invention also provide a display device having the above display panel. In some exemplary embodiments of the present invention, the display device includes a display unit, a light sensing unit, a driving controller and a light generation unit. The display unit has pixel electrodes disposed at a first substrate and a color filter disposed at a second substrate corresponding to the pixel electrodes to display images. The light sensing unit includes a switching element having a channel of a first length disposed at the first substrate and a sensor window having a second length disposed at the second substrate to sense an amount of an external light. The second length is longer than the first length. The driving controller outputs a driving control signal responsive to the amount of external light sensed by the light sensing unit. The light generation unit provides the display unit with an internal light controlled by the driving control signal.

BRIEF DESCRIPTION OF THE DRAWINGS

The present invention will become more apparent to those of ordinary skill in the art by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF THE INVENTION

Hereinafter, the present invention will be explained in detail with reference to the accompanying drawings.

Figure 1:
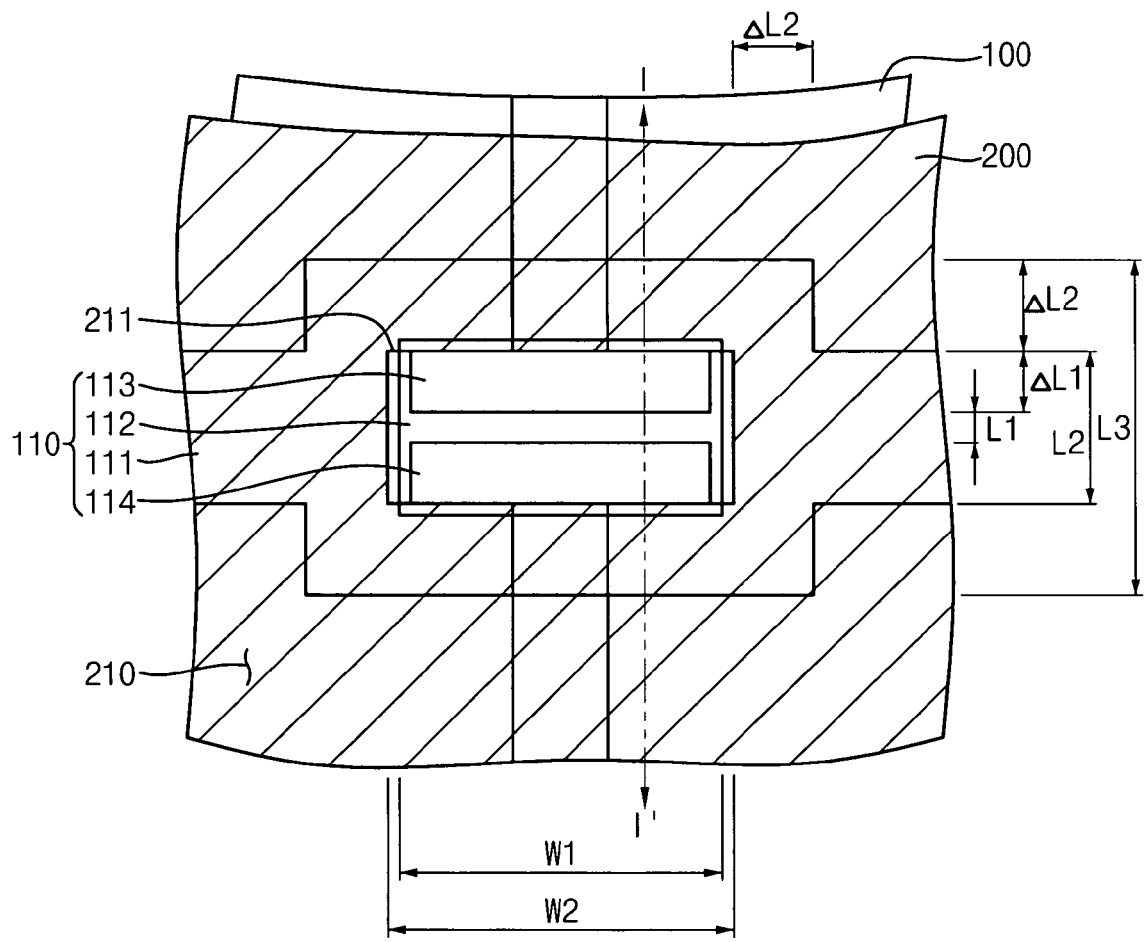
FIG. 1 is a plan view illustrating a photo sensor according to an exemplary embodiment of the present invention.
Figure 2:
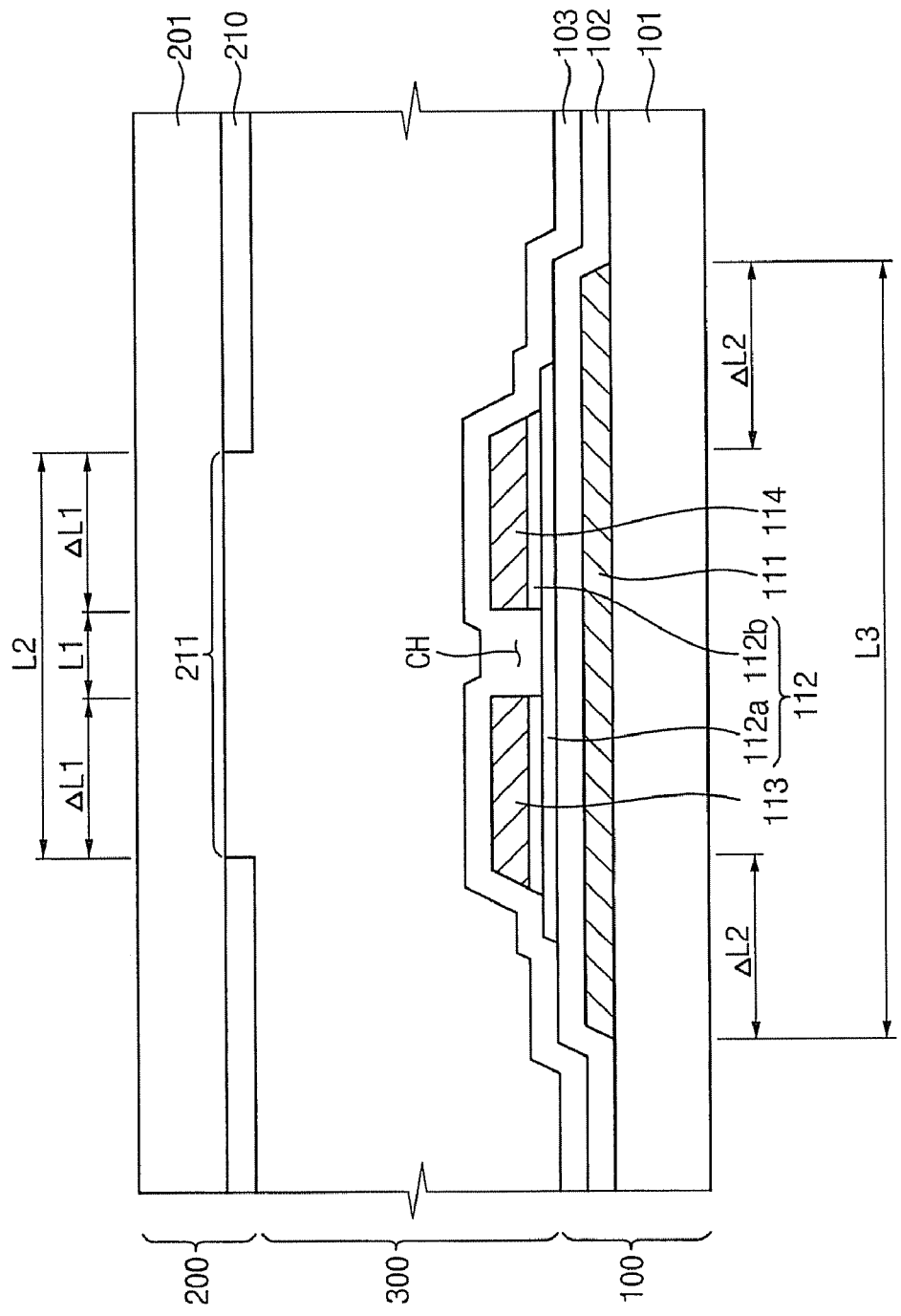
FIG. 2 is a cross sectional view taken along line I-I' in FIG. 1.

FIG. 1 is a plan view illustrating a photo sensor according to an exemplary embodiment of the present invention. FIG. 2 is a cross sectional view taken along line I-I' in FIG. 1.

Referring to FIGS. 1 and 2, the photo sensor includes a first substrate 100, a second substrate 200 facing the first substrate 100 and an insulating layer 300 disposed between the first and second substrates 100 and 200.

The first substrate 100 includes a photo switching element (e.g., amorphous silicon thin film transistor (a-Si TFT)) 110 formed on a first base substrate 101. The photo switching element 110 includes an amorphous silicon layer for forming a channel.

The photo switching element 110 has a gate electrode 111 formed from a first metal layer, and source electrode 113 and a drain electrode 114 formed from a second metal layer. A semiconductor layer 112 is disposed between the gate electrode 111 and the source and drain electrodes 113 and 114. The semiconductor layer 112 includes an activation layer 112a and a resistive contact layer (a-Si:H) 112b.

A portion of the resistive contact layer 112b is removed corresponding to the source and drain electrodes 113 and 114 to form a channel (CH) in the semiconductor layer 112, and the activation layer 112a is exposed through the channel (CH). The channel (CH) has a first length L1 and a first width W1. A resistance of the channel (CH) is varied in response to an amount of an external light incident on the channel (CH) and accordingly, an amount of current flowing through the channel (CH) is varied in response to the amount of the external light incident on the channel (CH).

A gate insulation layer 102 is disposed over the gate electrode 111 and a passivation layer 103 is disposed over the source and drain electrodes 113 and 114 and exposed portions of the gate insulation layer 102.

The second substrate 200 includes a second base substrate 201 and a light blocking layer 210 disposed at the second base substrate 201. A sensor window 211 is disposed at the light blocking layer 210 corresponding to the channel (CH) of the photo switching element 110. The sensor window 211 has a second length L2 and a second width W2.

A relationship exists between sizes of the photo switching element 110 and the sensor window 211. The second length L2 of the sensor window 211 is longer than the first length L1 of the channel (CH). The second width W2 of the sensor window 211 is wider than the first width W1 of the channel (CH).

Particularly, the sensor window 211 is extended with respect to the first length L1 in a direction substantially perpendicular to a longitudinal direction of the source and drain electrodes 113 and 114 by a first margin ΔL1, to account for a misalignment between the first and second substrates 100 and 200. In other words, the second length L2 of the sensor window 211 is longer than the first length L1 of the channel (CH) by twice the first margin ΔL1.

Thus, the sensor window 211 is extended to the second length L2 to assure receipt of the external light incident on the channel (CH) even when the misalignment occurs in the photo sensor. It is desirable that the first margin ΔL1 is about 7 μm when the first length L1 is about 4 μm. In other words, the second length L2 of the sensor window 211 is at least about 18 μm.

The gate electrode 111 of the photo switching element 110 has a larger area than the sensor window 211 to prevent light exiting a lower portion of the first base substrate 101 from leaking out through the sensor window 211. For example, the gate electrode 111 may be extended from both marginal edges of the sensor window 211 by a second margin ΔL2, respectively, to have a third length L3. A width of the gate electrode 111 is about W2 plus two times the second margin ΔL2. It is desirable that the third length L3 of the gate electrode 111 is at least about 38 μm when the second length L2 of the sensor window 211 is at least about 18 μm. In other words, for example, when the first margin ΔL1 is about 7 μm, the second margin ΔL2 is about 10 μm.

Figure 3:
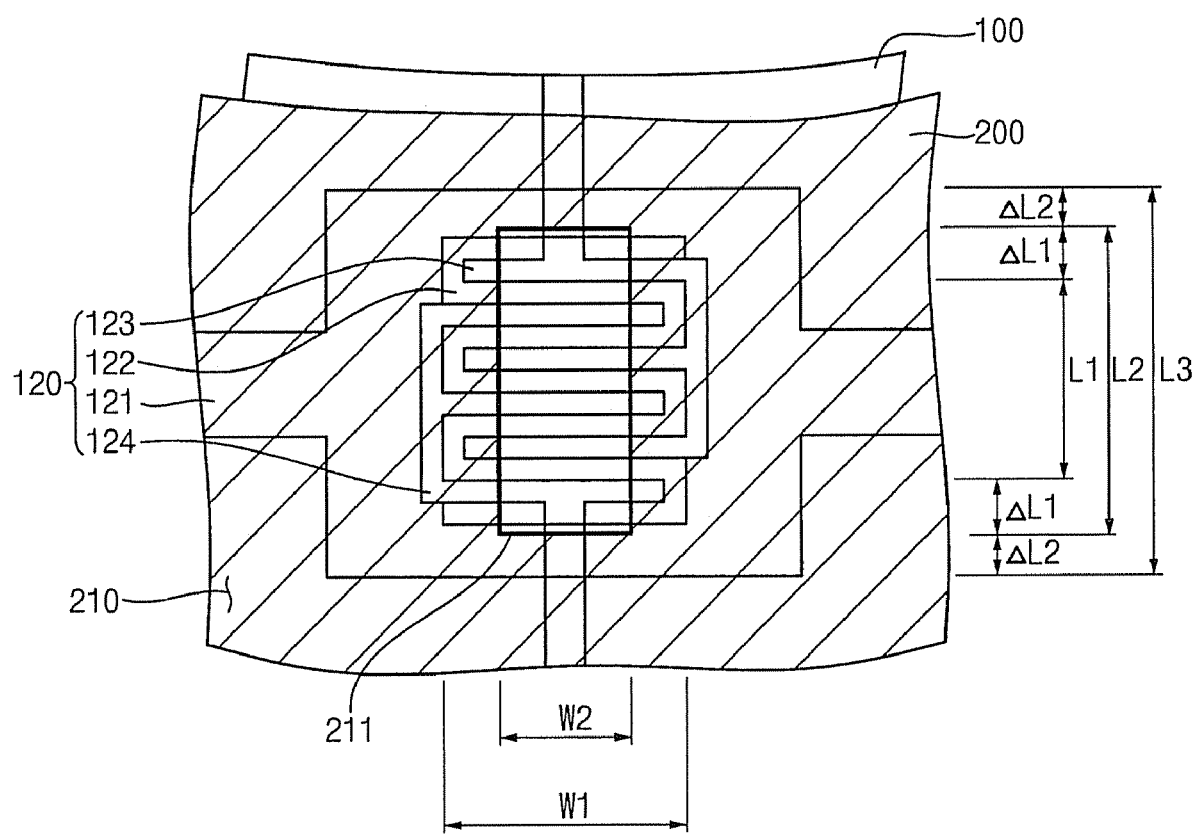
FIG. 3 is a plan view illustrating a photo sensor according to an exemplary embodiment of the present invention.

FIG. 3 is a plan view illustrating a photo sensor according to an exemplary embodiment of the present invention.

Referring to FIG. 3, a photo switching element 120 is disposed at a first substrate 100. The photo switching element 120 includes a gate electrode 121 formed from a first metal layer, and a source electrode 123 and a drain electrode 124 formed from a second metal layer. A semiconductor layer 122 is disposed between the gate electrode 121 and the source and drain electrodes 123 and 124.

A portion of a resistive contact layer is removed corresponding to the source and drain electrodes 123 and 124 to form a channel on the semiconductor layer 122, wherein an activation layer is exposed through the channel.

As shown in FIG. 3, the source and drain electrodes 123 and 124 are each formed in a shape of teeth of a comb. The channel defined by the source and drain electrodes 123 and 124 has a length L1 and is disposed in a zigzag pattern having a width W1. Accordingly, a ratio of the width W1 of the zigzag pattern to the length L1 of the channel is increased to improve characteristics of the photo switching element 120. A resistance of the channel is varied in response to an amount of external light incident on the channel and accordingly, an amount of current flowing through the channel is varied to detect the amount of the external light incident on the channel.

The sensor window 211 corresponding to the photo switching element 120 is defined on the second substrate 200 by the light blocking layer 210. The sensor window 211 has a second length L2 and a second width W2.

The photo switching element 120 has the following relationship with respect to the sensor window 211. The second length L2 of the sensor window 211 corresponds to the first width W1 of the channel of the photo switching element 120. In addition, the second length L2 of the sensor window 211 includes a first margin ΔL1 to account for misalignment between the first and second substrates 100 and 200.

Particularly, the second length L2 of the sensor window 211 is extended in a direction perpendicular to a longitudinal direction of the source and drain electrodes 123 and 124 by the first margin ΔL1 to account for the misalignment between the first and second substrates 100 and 200.

Thus, the sensor window 211 is extended to the second length L2 including the first margin ΔL1 to ensure receipt of the external light incident on the channel even when the misalignment occurs in the photo sensor. It is desirable that the first margin ΔL1 is at least about 7 μm when a degree of the misalignment of about 7 μm occurs between the first and second substrates 100 and 200.

The gate electrode 121 of the photo switching element 120 has a larger area than the sensor window 211 to prevent light exiting a lower portion of a first base substrate 101 from leaking out through the sensor window 211. For example, the gate electrode 121 may have a third length L3 extended by a second margin ΔL2 from each marginal edge of the sensor window 211. In an exemplary embodiment, the second margin ΔL2 is larger than the first margin ΔL1. For example, when the second length L2 of the sensor window 211 is at least about 18 μm, the third length L3 of the gate electrode 121 is at least about 38 μm.

FIGS. 4 through 13 are plan views illustrating the photo sensor according to various exemplary embodiments of the present invention. The same reference numerals will be used to refer to the same or like elements as those described in FIG. 1.

Figure 4:
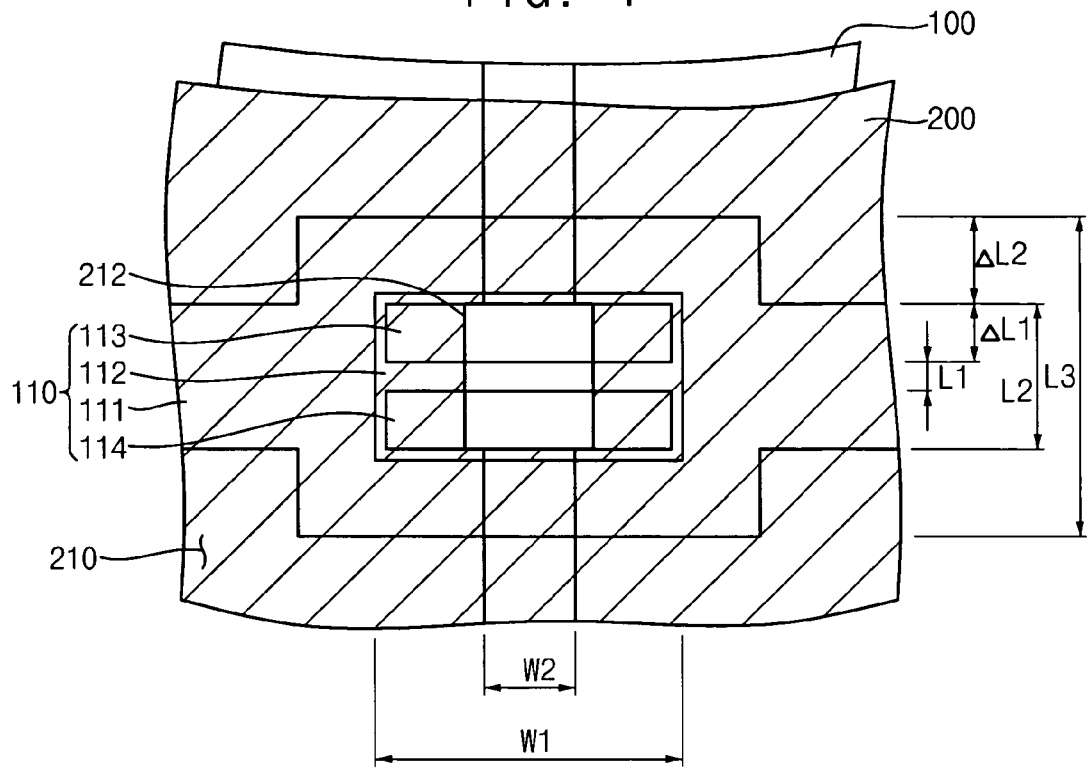
FIG. 4 is a plan view illustrating a photo sensor according to an exemplary embodiment of the present invention.

FIG. 4 is a plan view illustrating the photo sensor according to an exemplary embodiment of the present invention.

Referring to FIG. 4, the photo sensor includes the first substrate 100 and the second substrate 200 wherein the photo switching element 110 and the sensor window 212 are disposed at the first and second substrates 100 and 200, respectively.

The photo switching element 110 includes the gate electrode 111 formed from the first metal layer, and the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114 (as shown in FIG. 1).

The second layer 200 includes the second base substrate 201 and the light blocking layer 210 disposed at the base substrate 201. A sensor window 212 is disposed at the light blocking layer 210 corresponding to the channel (CH) of the photo switching element 110.

The sensor window 212 has a second length L2 and a second width W2. As shown in FIG. 4, the second width W2 of the sensor window 212 may be narrower than the first width W1 of the channel (CH).

The sensor window 212 includes the first margin ΔL1 by which the sensor window 212 is extended from both sides of the channel (CH) in the direction substantially perpendicular to the longitudinal direction of the source and drain electrodes 113 and 114 to account for misalignment between the first and second substrates 100 and 200.

The gate electrode 111 of the photo switching element 110 has a larger area than the sensor window 211 to prevent light exiting the lower portion of the first base substrate 101 from leaking out through the sensor window 211.

Figure 5:
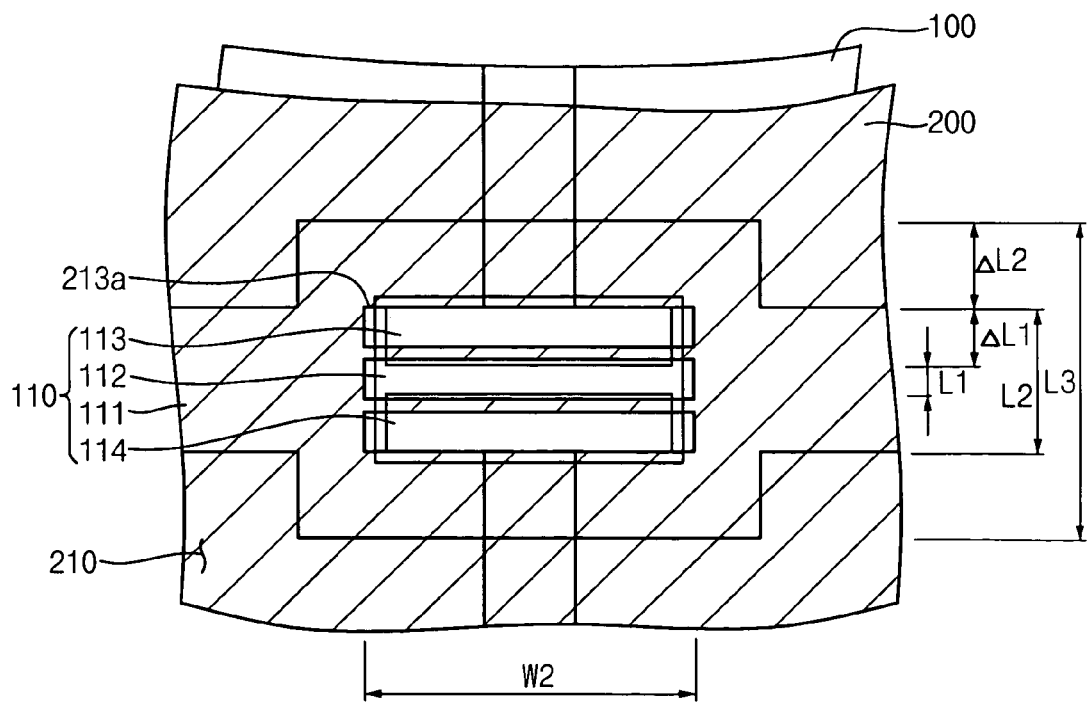
FIG. 5 is a plan view illustrating a photo sensor according to an exemplary embodiment of the present invention.

FIG. 5 is a plan view illustrating the photo sensor according to another exemplary embodiment of the present invention.

Referring to FIG. 5, the photo sensor includes the first substrate 100 on which the photo switching element 110 is disposed and the second substrate 200 on which the sensor window is disposed.

The photo switching element 110 includes the gate electrode 111 formed from the first metal layer, and the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second layer 200 includes the second base substrate 201 and the light blocking layer 210 disposed at the second base substrate 201. Sub sensor windows 213a are disposed at the light blocking layer 210 corresponding to the channel (CH) of the photo switching element 110.

As shown in FIG. 5, the sub sensor windows 213a are arranged along a length of the channel (CH) at a region defined by the second length L2 and the second width W2. Each of the sub sensor windows 213a has a rectangular shape with the second width W2 extending in a same direction as a longitudinal length of each of the sub sensor windows 213a. The second length L2 of the region includes the first margin ΔL1 to account for misalignment between the first and second substrates 100 and 200.

The gate electrode 111 of the photo switching element 110 has a larger area than the region where the sub sensor windows 213a are disposed to prevent light exiting the lower portion of the first base substrate 101 from leaking out through the sub sensor windows 213a.

Figure 6:
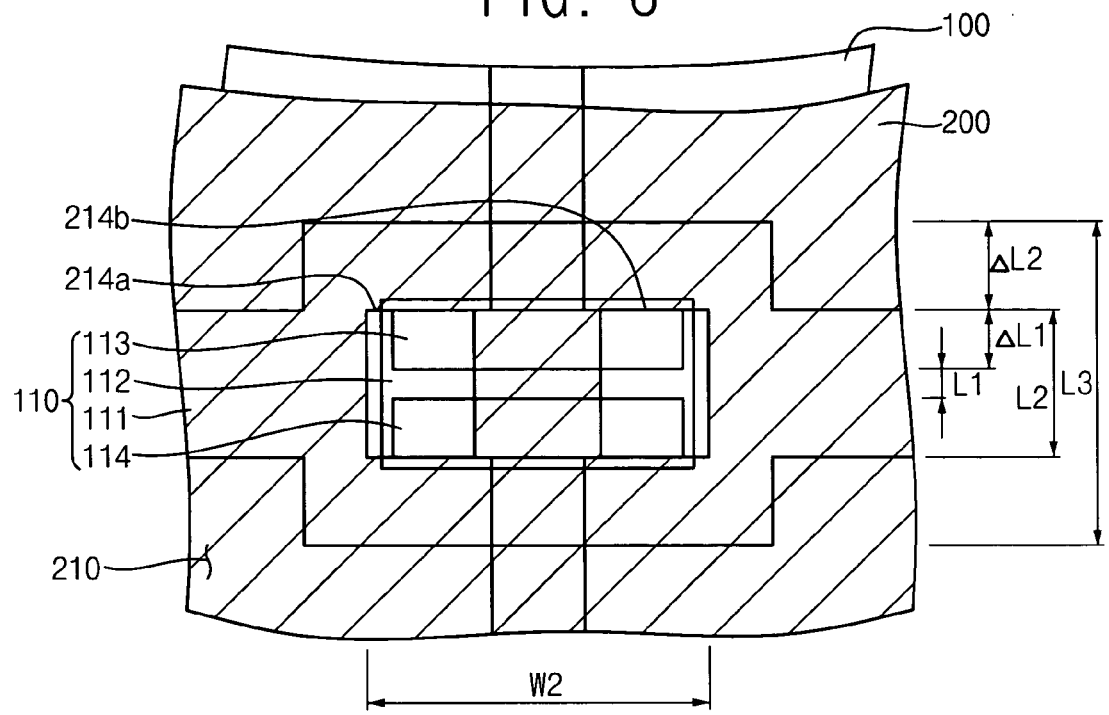
FIG. 6 is a plan view illustrating a photo sensor according to another exemplary embodiment of the present invention.

FIG. 6 is a plan view illustrating the photo sensor according to another exemplary embodiment of the present invention.

Referring to FIG. 6, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed from the first metal layer, and the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second layer 200 includes the second base substrate 201 and the light blocking layer 210 disposed at the second base substrate 201. A first sub sensor window 214a and a second sub sensor window 214b are disposed at the light blocking layer 210 corresponding to the channel (CH) of the photo switching element 110.

The first and second sub sensor windows 214a and 214b are disposed at both end portions of the region defined by the second length L2 and the second width W2. The first and second sub sensor windows 214a and 214b are spaced apart from each other along a direction of the second width W2. Each of the first and second sub sensor windows 214a and 214b has a rectangular shape with a longitudinal direction of each of the first and second sub sensors windows 214a and 214b being disposed along the second length L2. The second length L2 of the region includes the first margin ΔL1 to account for misalignment between the first and second substrates 100 and 200.

The gate electrode 111 of the photo switching element 110 has an area larger than the region where the first and second sub sensor windows 214a and 214b are disposed to prevent light exiting the lower portion of the first base substrate 101 from leaking out through the first and second sub sensor windows 214a and 214b.

Figure 7:
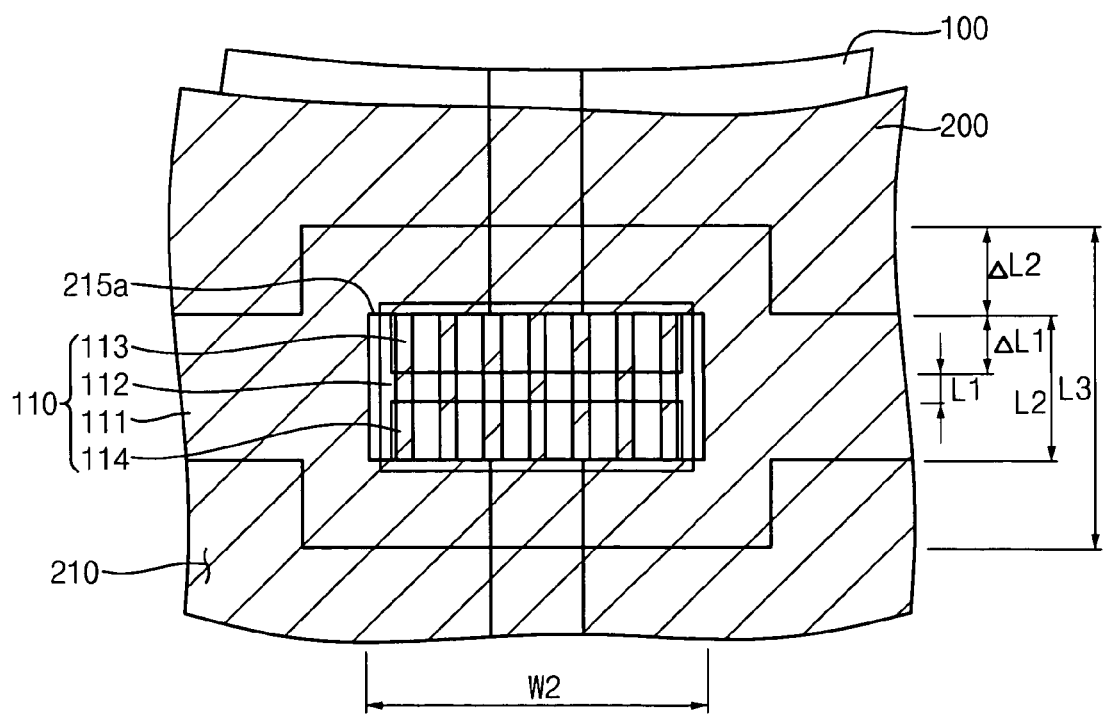
FIG. 7 is a plan view illustrating a photo sensor according to another exemplary embodiment of the present invention.

FIG. 7 is a plan view illustrating the photo sensor according to another exemplary embodiment of the present invention.

Referring to FIG. 7, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed by the first metal layer, and the source and drain electrodes 113 and 114 formed by the second metal layer. The semiconductor layer 112 is disposed between the gate electrode 111 and the source and drain electrodes 113 and 114. The semiconductor layer 112 includes the channel (CH) corresponding to the source and drain electrodes 113 and 114.

The second substrate 200 includes the second base substrate 201 and the light blocking layer 210 disposed at the second base substrate 201. A plurality of sub sensor windows 215a are disposed at the light blocking layer 210 corresponding to the channel (CH) of the photo switching element 110. Each of the sub sensor windows 215a extends over a portion of the source electrode 113, the channel (CH) and a portion of the drain electrode 114.

The sub sensor windows 215a are arranged parallel to each other along a length of the channel (CH) in a region defined by the second length L2 and the second width W2. The sub sensor windows 215a extend over a width of the channel (CH). Each of the sub sensor windows 215a has a rectangular shape with a longitudinal length of each of the sub sensor windows 215a extending along a same direction as the second length L2. In other words, a longer side of the rectangular shape is extended along the second length L2. The second length L2 of the region includes the first margin ΔL1 to account for misalignment between the first and second substrates 100 and 200.

The gate electrode 111 of the photo switching element 110 has a larger area than the region where the sub sensor windows 215a are disposed to prevent light exiting the lower portion of the first base substrate 101 from leaking out through the sub sensor windows 215a.

Figure 8:
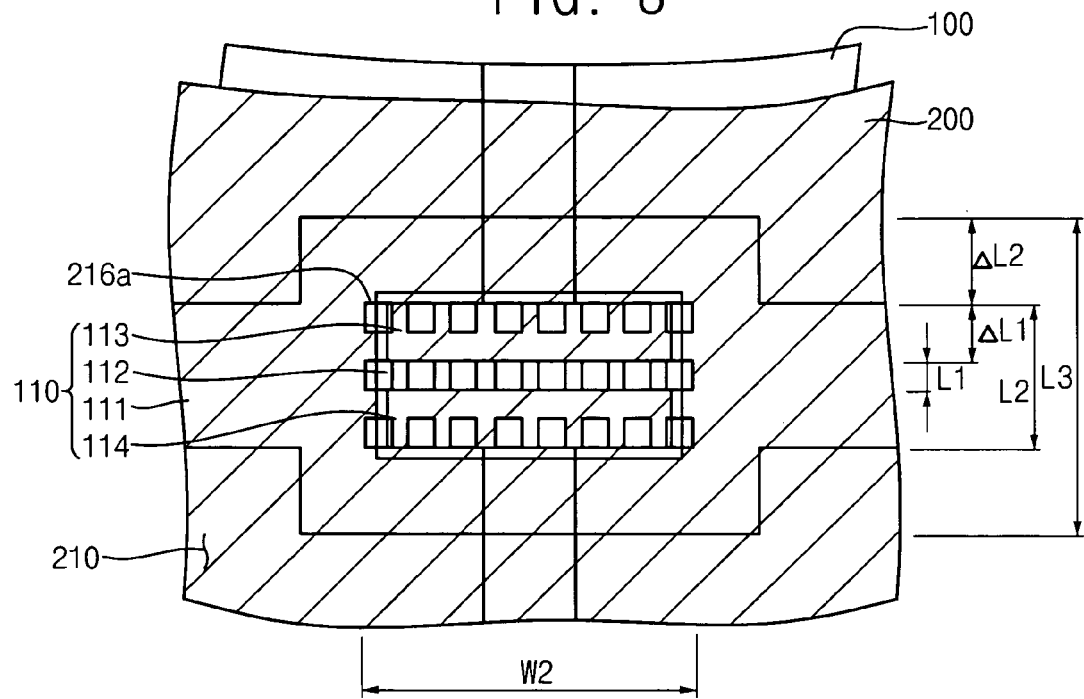
FIG. 8 is a plan view illustrating a photo sensor according to another exemplary embodiment of the present invention.

FIG. 8 is a plan view illustrating the photo sensor according to still another exemplary embodiment of the present invention.

Referring to FIG. 8, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed from the first metal layer, and the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second layer 200 includes the second base substrate 201 and the light blocking layer 210 disposed at the second base substrate 201. A plurality of sub sensor windows 216a are disposed in a dot matrix pattern on the light blocking layer 210 corresponding to the channel (CH) of the photo switching element 110. Each of the sub sensor windows 216a has a rectangular shape.

As shown in FIG. 8, the sub sensor windows 216a are uniformly arranged in rows and columns of three sub sensor windows 216a. The columns of three sub sensor windows 216a are arranged a long a length of the channel (CH) in a region defined by the second length L2 and the second width W2. Each row of sub sensor windows 216a is disposed parallel to each other row of sub sensor windows 216a. Additionally, each of the columns of three sub sensor windows 216a is disposed parallel to each other such that a longitudinal length of each of the columns of three sub sensor windows 216a extends along a same direction as the second length L2. The second length L2 of the region includes the first margin ΔL1 to account for misalignment between the first and second substrates 100 and 200.

The gate electrode 111 of the photo switching element 110 has an area larger than an area where the sub sensor windows 216a are disposed so that light exiting the lower portion of the first base substrate 101 may not leak from the sub sensor windows 216a.

Figure 9:
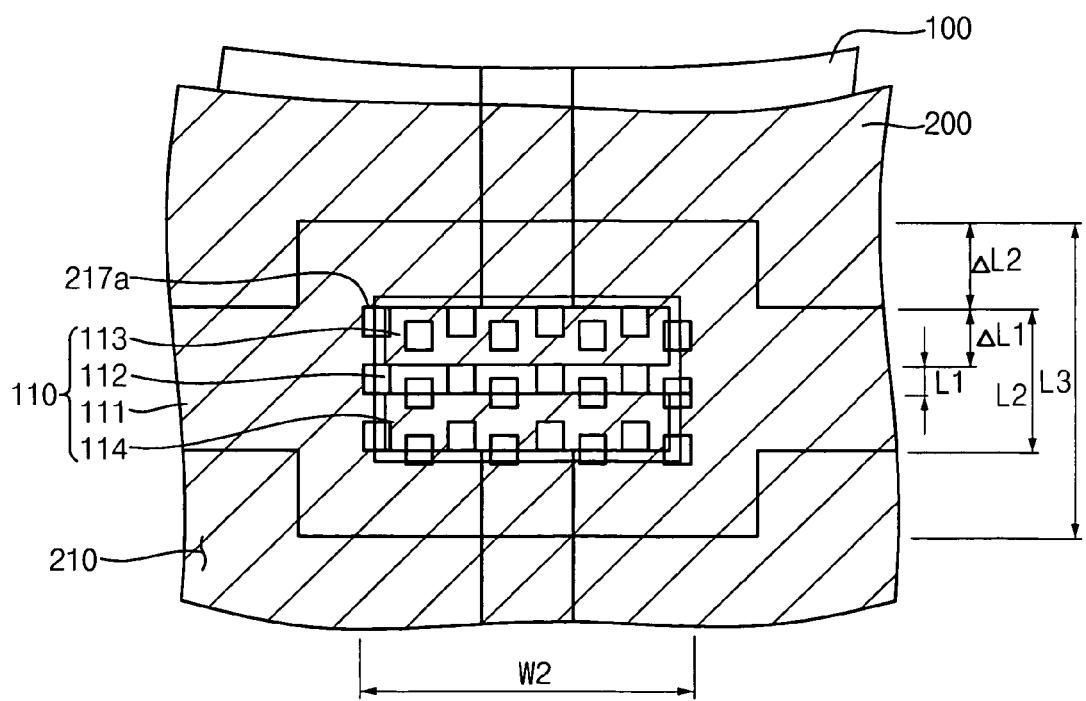
FIG. 9 is a plan view illustrating a photo sensor according to another exemplary embodiment of the present invention.

FIG. 9 is a plan view illustrating the photo sensor according to still another exemplary embodiment of the present invention.

Referring to FIG. 9, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed from the first metal layer, and the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second substrate 200 includes the second base substrate 201 and the light blocking layer 210 disposed at the second base substrate 201. A plurality of sub sensor windows 217a are disposed in a dot matrix pattern on the light blocking layer 210 corresponding to the channel (CH) of the photo switching element 110. Each of the sub sensor windows 217a has a rectangular shape.

As shown in FIG. 9, the sub sensor windows 217a are arranged substantially similar to the sub sensor windows 216a of FIG. 8 except that the sub sensor windows 217a of FIG. 9 are disposed in a zigzag configuration on a region defined by the second length L2 and the second width W2. In other words, the sub sensor windows are disposed in columns of three sub sensor windows 217a that are disposed substantially parallel to each other along the second length. However, each of the columns of three sub sensor windows 217a is staggered in position relative to each adjacent column of three sub sensor windows 217a to form the zig-zag configuration. The second length L2 of the region includes the first margin ΔL1 to account for misalignment between the first and second substrates 100 and 200.

The gate electrode 111 of the photo switching element 110 has an area larger than an area where the sub sensor windows 217a are disposed so that light exiting the lower portion of the first base substrate 101 may not leak from the sub sensor windows 217a.

Figure 10:
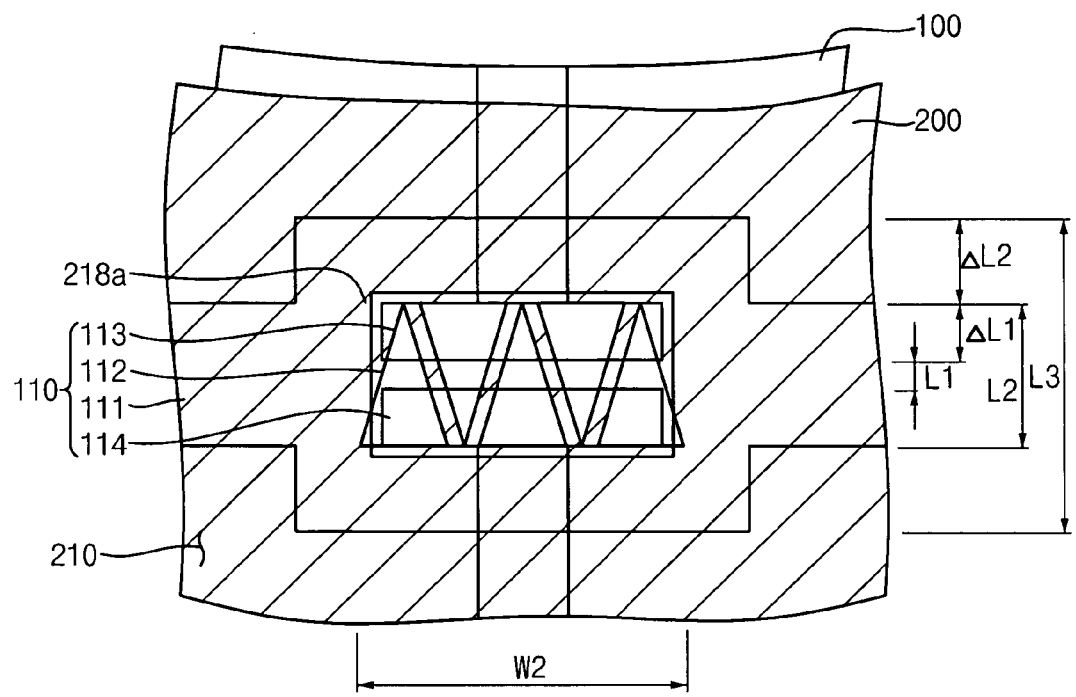
FIG. 10 is a plan view illustrating a photo sensor according to still another exemplary embodiment of the present invention.

FIG. 10 is a plan view illustrating the photo sensor according to still another exemplary embodiment of the present invention.

Referring to FIG. 10, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed from the first metal layer, and the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second substrate 200 includes the second base substrate 201 and the light blocking layer 210 disposed at the second base substrate 201. A plurality of sub sensor windows 218a are disposed on the light blocking layer 210 corresponding to the channel (CH) of the photo switching element 110. Each of the sub sensor windows 218a extends over a portion of the source electrode 113, the channel (CH) and a portion of the drain electrode 114.

As shown in FIG. 10, the sub sensor windows 218a are arranged in a region defined by the second length L2 and the second width W2. Each of the sub sensor windows 218a has an isosceles triangle shape with a height of the triangle being the second length L2. The sub sensor windows 218a are arranged in a row, alternately inverted with respect to each adjacent sub sensor window 218a. The second length L2 of the region includes the first margin ΔL1 to account for misalignment between the first and second substrates 100 and 200.

The gate electrode 111 of the photo switching element 110 has an area larger than an area where the sub sensor windows 218a are disposed so that light exiting the lower portion of the first base substrate 101 may not leak from the sub sensor windows 218a.

Figure 11:
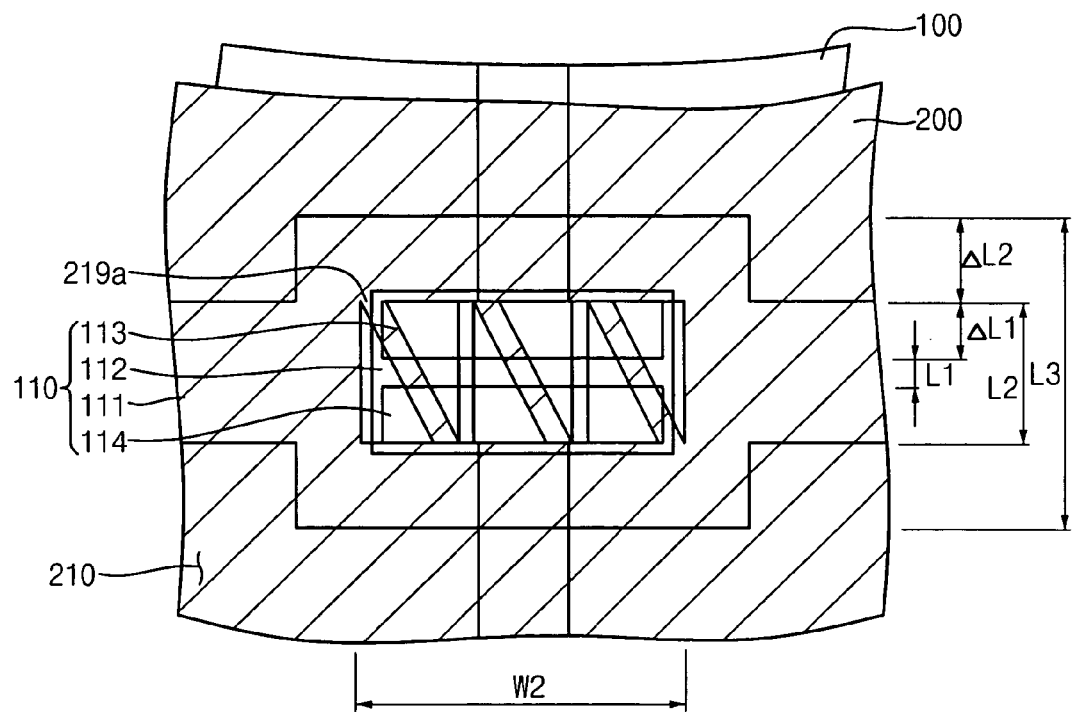
FIG. 11 is a plan view illustrating a photo sensor according to still another exemplary embodiment of the present invention.

FIG. 11 is a plan view illustrating the photo sensor according to still another exemplary embodiment of the present invention.

Referring to FIG. 11, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed from the first metal layer, and the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second substrate 200 includes the second base substrate 201 and the light blocking layer 210 disposed at the second base substrate 201. A plurality of sub sensor windows 219a are disposed at the light blocking layer 210 corresponding to the channel (CH) of the photo switching element 110. Each of the sub sensor windows 219a extends over a portion of the source electrode 113, the channel (CH) and a portion of the drain electrode 114.

As shown in FIG. 11, the sub sensor windows 219a are arranged in a region defined by the second length L2 and the second width W2. Each of the sub sensor windows 219a has a right triangle shape with a height of the triangle being the second length L2. The sub sensor windows 219a are arranged in a row, alternately inverted with respect to each adjacent sub sensor window 219a. The second length L2 of the region includes the first margin ΔL1 to account for misalignment between the first and second substrates 100 and 200.

The gate electrode 111 of the photo switching element 110 has an area larger than an area where the sub sensor windows 219a are disposed so that light exiting the lower portion of the first base substrate 101 may not leak from the sub sensor windows 219a.

Figure 12:
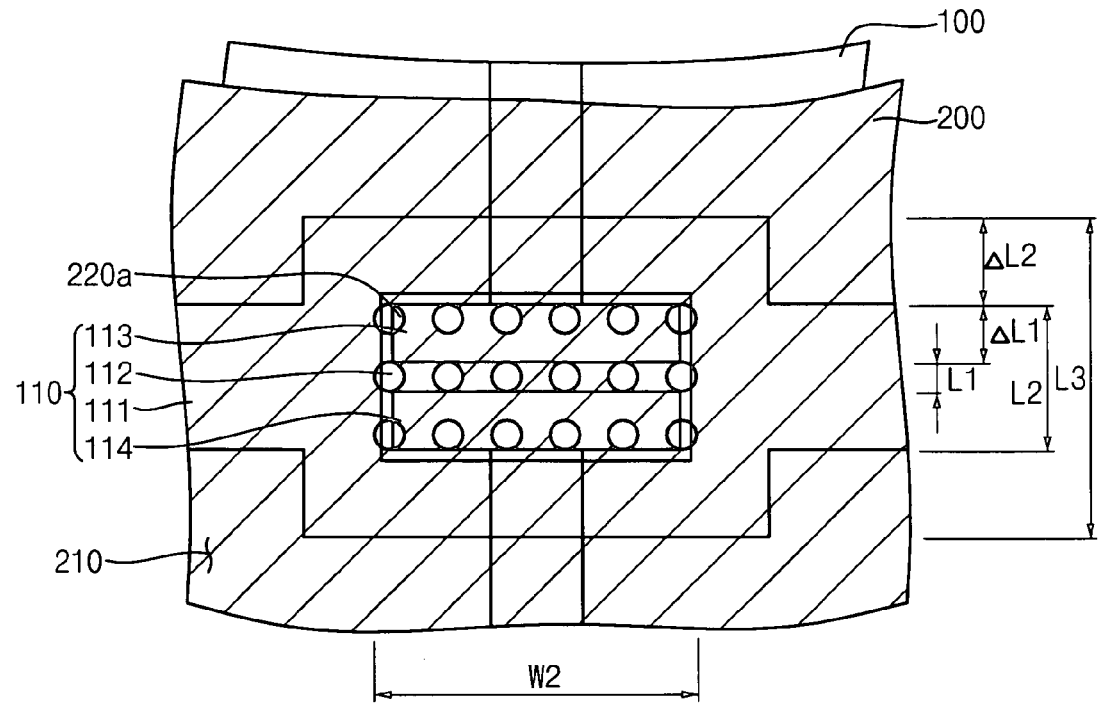
FIG. 12 is a plan view illustrating a photo sensor according to still another exemplary embodiment of the present invention.

FIG. 12 is a plan view illustrating the photo sensor according to still another exemplary embodiment of the present invention.

Referring to FIG. 12, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed from the first metal layer, and the source and drain electrode 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second substrate 200 includes the second base substrate 201 and the light blocking layer 210 disposed at the second base substrate 201. A plurality of sub sensor windows 220a are disposed in a dot matrix pattern on the light blocking layer 210 corresponding to the channel (CH) of the photo switching element 110. Each of the sub sensor windows 220a has a circular shape.

As shown in the FIG. 12, the sub sensor windows 220a are uniformly arranged in rows and columns of three sub sensor windows 220a. The columns of three sub sensor windows 220a are arranged in a region defined by the second length L2 and the second width W2. Each row of sub sensor windows 220a is disposed parallel to each other row of sub sensor windows 220a. Additionally, each of the columns of three sub sensor windows 220a is disposed parallel to each other such that a longitudinal length of each of the columns of three sub sensor windows 220a extends along a same direction as the second length L2. The second length L2 of the region includes the first margin ΔL1 to account for misalignment between the first and second substrates 100 and 200.

The gate electrode 111 of the photo switching element 110 has an area larger than an area where the sub sensor windows 220a are disposed so that light exiting the lower portion of the first base substrate 101 may not leak from the sub sensor windows 220a.

Figure 13:
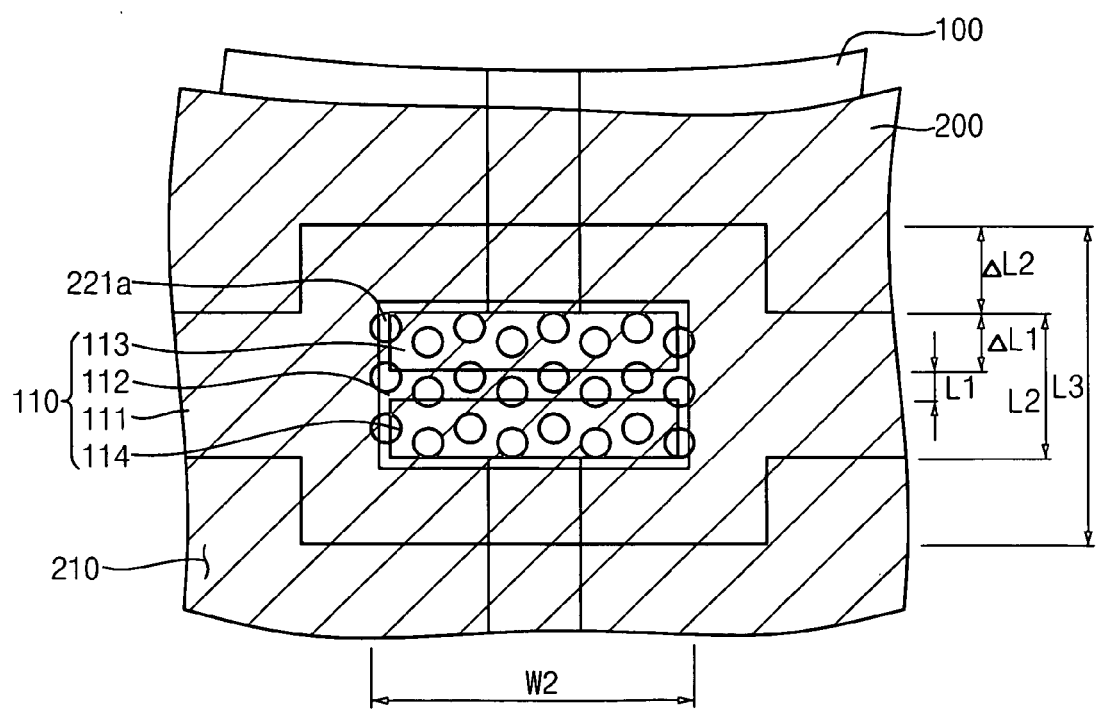
FIG. 13 is a plan view illustrating a photo sensor according to still another exemplary embodiment of the present invention.

FIG. 13 is a plan view illustrating the photo sensor according to still another exemplary embodiment of the present invention.

Referring to FIG. 13, the photo sensor includes the first substrate 100 and the second substrate 200, wherein the photo switching element 110 and the sensor window are disposed at the first and second substrates 100 and 200, respectively.

The photo switching element 110 includes the gate electrode 111 formed from the first metal layer, the source and drain electrodes 113 and 114 formed from the second metal layer. The semiconductor layer 112 is disposed between the gate electrode 111 and the source and drain electrodes 113 and 114. The semiconductor layer 112 includes the channel (CH) disposed between the source and drain electrodes 113 and 114.

The second substrate 200 includes the second base substrate 201 and the light blocking layer 210 disposed at the second base substrate 201. A plurality of sub sensor windows 221a are disposed in a dot matrix pattern on the light blocking layer 210 corresponding to the channel (CH) of the photo switching element 110. Each of the sub sensor windows 221a has a circular shape.

The sub sensor windows 221a are arranged substantially similar to the sub sensor windows 220a of FIG. 12 except that the sub sensor windows 221a of FIG. 13 are disposed in a zigzag configuration in a region defined by the second length L2 and the second width W2. In other words, the sub sensor windows are disposed in columns of three sub sensor windows 221a that are disposed substantially parallel to each other along the second length. However, each of the columns of three sub sensor windows 221a is staggered in position relative to each adjacent column of three sub sensor windows 221a to form the zig-zag configuration. The second length L2 of the region includes the first margin ΔL1 to account for misalignment between the first and second substrates 100 and 200.

The gate electrode 111 of the photo switching element 110 has an area larger than an area where the sub sensor windows 221a are disposed so that light exiting the lower portion of the first base substrate 101 may not leak from the sub sensor windows 221a.

Figure 14:
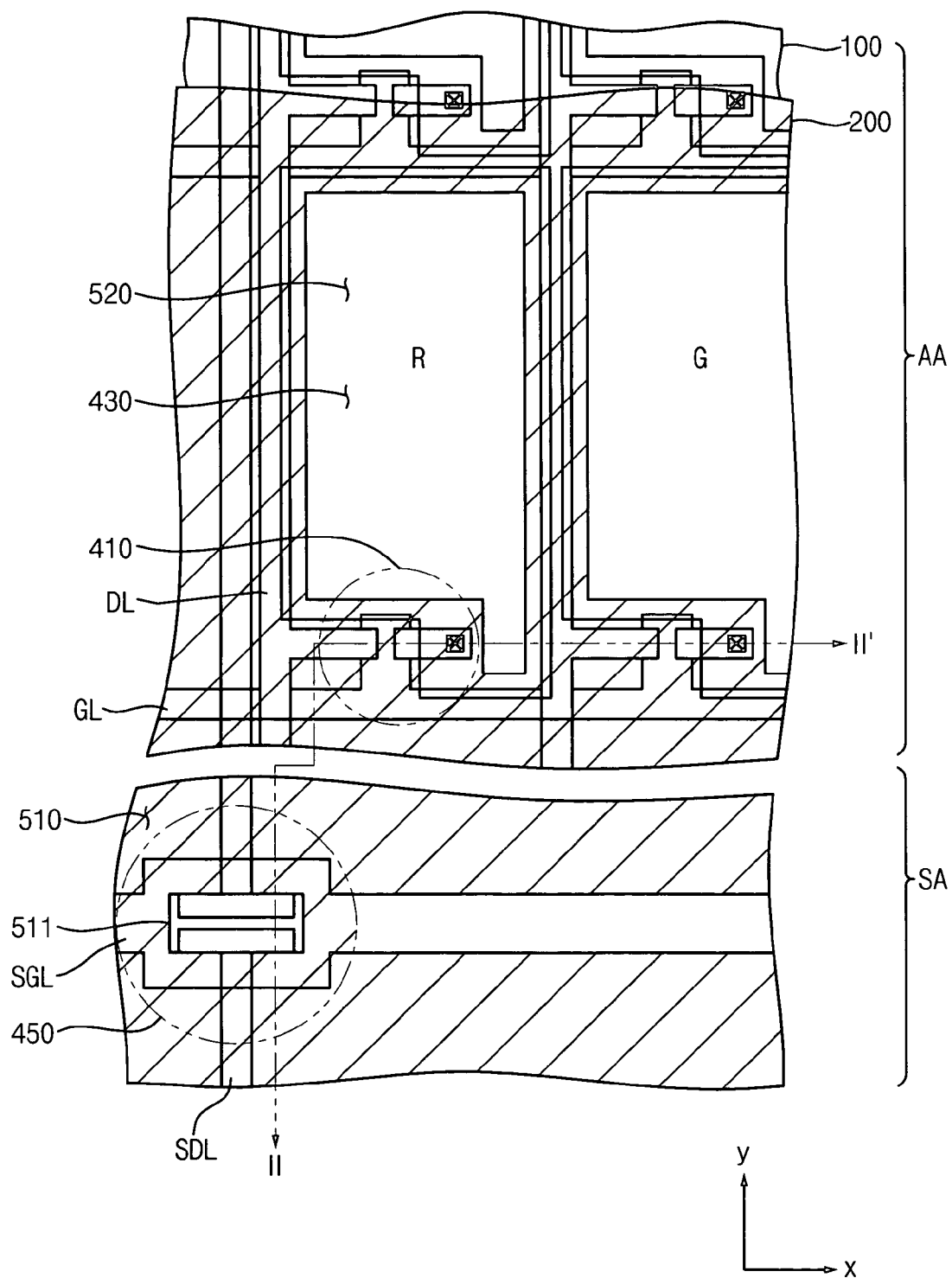
FIG. 14 is a partial plan view illustrating a display panel according to an exemplary embodiment of the present invention.
Figure 15:
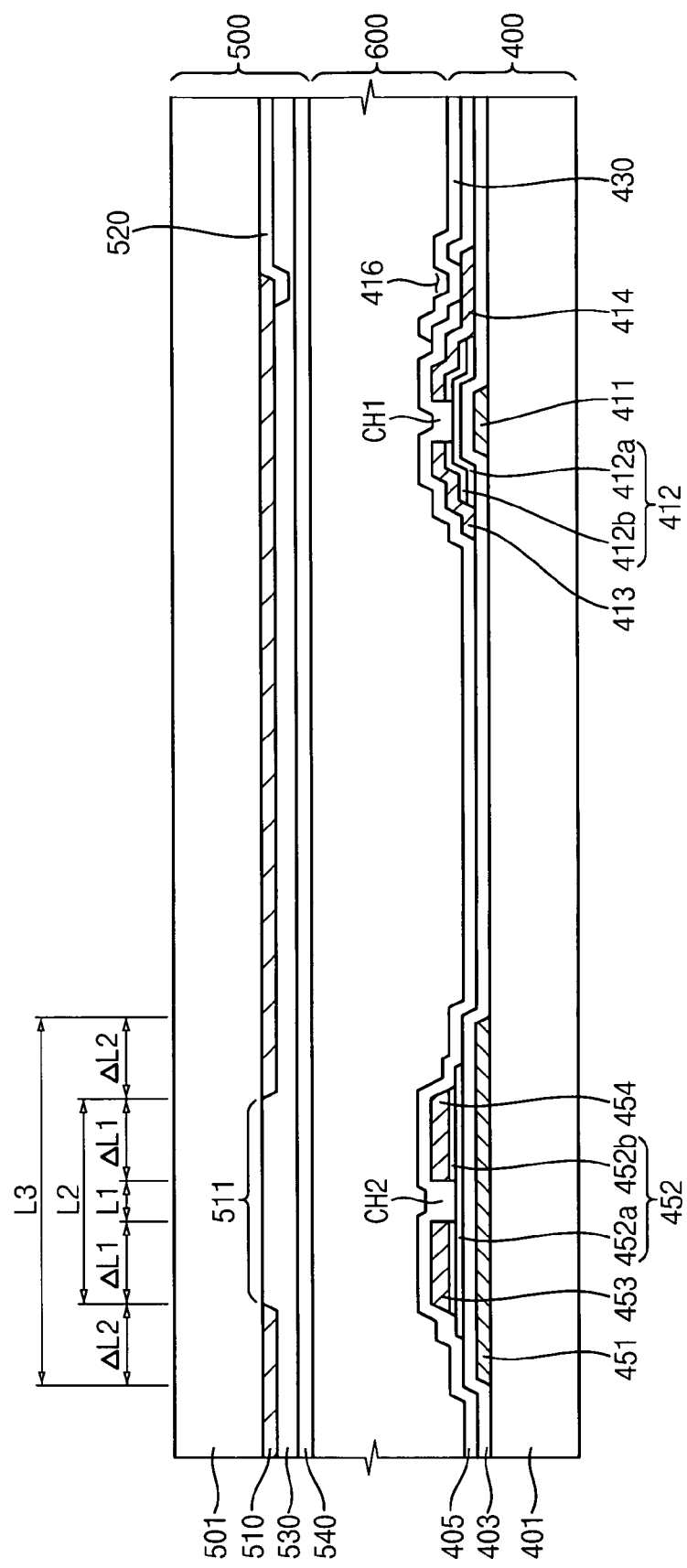
FIG. 15 is a cross sectional view taken along line II-II' in FIG. 14.

FIG. 14 is a partial plan view illustrating a display panel according to an exemplary embodiment of the present invention. FIG. 15 is a cross sectional view taken along line II-II' in FIG. 14.

Referring to FIGS. 14 and 15, the display panel includes an array substrate 400 and a color filter substrate 500.

The array substrate 400 includes an active area AA and a light sensing area SA for sensing light. Data lines DL, gate lines GL, switching elements 410 coupled to the data lines DL and gate lines GL, and pixels coupled to the respective switching elements 410 are disposed in the active area M. Photo switching elements 450 coupled to the data lines DL and the gate lines GL are disposed in the light sensing area SA.

The color filter substrate 500 has a color filter 520 disposed in a first region corresponding to the active region AA and a sensor window 511 disposed in a second region corresponding to the light sensing area SA. A space for each unit pixel, which is filled with the color filter 520, is defined by a light blocking layer 510.

The color filter 520 includes respective color filters for red (R), green (G) and blue (B) colors to represent corresponding colors of incident light.

Referring still to FIGS. 14 and 15, the display panel includes the array substrate 400, the color filter substrate 500 facing the array substrate 400 and a liquid crystal layer 600 disposed between the array substrate 400 and the color filter substrate 500.

The array substrate 400 includes a transparent substrate 401, the switching element 410, a pixel electrode 430 for a liquid crystal capacitor (CLC) and the photo switching element 450.

The switching element 410 includes a first gate electrode 411, a first semiconductor layer 412, a first source electrode 413 and a first drain electrode 414. The first gate electrode 411 is disposed at the transparent substrate 401 and a gate insulation layer 403 is disposed at the first gate electrode 411. The first semiconductor layer 412 is disposed at the gate insulation layer 403 corresponding to the first gate electrode 411.

The first semiconductor layer 412 includes a first activation layer 412a and a first resistive contact layer 412b disposed at the first activation layer 412a. A portion of the first resistive contact layer 412b is removed between the source and drain electrodes 413 and 414 so that a channel (CH1) through which the activation layer 412a is exposed is formed in the first semiconductor layer 412. A passivation layer 405 is disposed at the first source and drain electrodes 413 and 414.

A portion of the passivation layer 405 disposed at the first drain electrode 414 is removed to form a contact hole 416. The pixel electrode 430 for a liquid crystal capacitor (CLC) is electrically coupled to the drain electrode 414 through the contact hole 416.

The photo switching element 450 includes a second gate electrode 451 electrically connected to a supplemental gate line SGL, a second semiconductor layer 452, a second source electrode 453 electrically connected to a supplemental data line SDL and a second drain electrode 454. The second gate electrode 451 is disposed at the transparent substrate 401 and the gate insulation layer 403 is disposed at the second gate electrode 451. The second semiconductor layer 452 is disposed at the gate insulation layer 403 corresponding to the second gate electrode 451.

The second semiconductor layer 452 includes a second activation layer 452a and a second resistive contact layer 452b disposed at the second activation layer 452a. A portion of the second resistive contact layer 452b is removed between the second source and drain electrodes 453 and 454 so that a second channel (CH2) having a first length L1 is disposed at the first semiconductor layer 452. A passivation layer 405 is disposed at the second source and drain electrodes 453 and 454.

The first and second gate electrodes 411 and 451, and the first and second source and drain electrodes 413, 414, 453 and 454 may be formed as a single metal layer or a multi metal layer. The single or multi metal layer may include, for example, aluminum (Al), silver (Ag), copper (Cu), molybdenum (Mo), an alloy of aluminum, silver, copper or molybdenum, chromium (Cr), tantalum (Ta) or titanium (Ti), etc.

The color filter substrate 500 includes a transparent substrate 501, the light blocking layer 510, the color filter 520, a protective layer 530 and a common electrode layer 540.

Particularly, the light blocking layer 510 defines a space for each unit pixel corresponding to the pixel electrode 430 and a region of the sensor window 511. The sensor window 511 has a second length L2 and a second width W2 substantially similar to a structure of FIG. 1.

Particularly, the second length L2 of the sensor window 511 corresponds to the first length L1 extending from both ends of the second channel (CH2) by the first margin ΔL1 to account for misalignment between the array substrate 400 and color filter substrate 500. For example, when the first length L1 is about 4 μm and the first margin ΔL1 is 7 μm, the second length L2 may be greater than about 18 μm.

The third length L3 of the second gate electrode 451 of the photo switching element 450 is longer than the second length L2 of the sensor window 511 so that light exiting a lower portion of the transparent substrate 401 may be prevented from leaking out from the sensor window 511. For example, the third length L3 extends beyond both sides of the second length L2 by the second margin ΔL2 on each respective side of the second length L2. For example, when the second length L2 of the sensor window 511 is above about 18 μm, the third length L3 is above about 38 μm.

The color filter 520 includes color filters for red, green and blue colors. A space for each unit pixel defined by the light blocking layer 510 is filled with the color filter 520.

The protective layer 530 is disposed at the light blocking layer 510 and the color filter 520 and functions as a planarization film and a protective film. The common electrode layer 540 is a transparent conductive layer to which an electrode of the liquid crystal capacitor (CLC) is coupled. A common voltage is applied to the common electrode layer 540.

Figure 16:
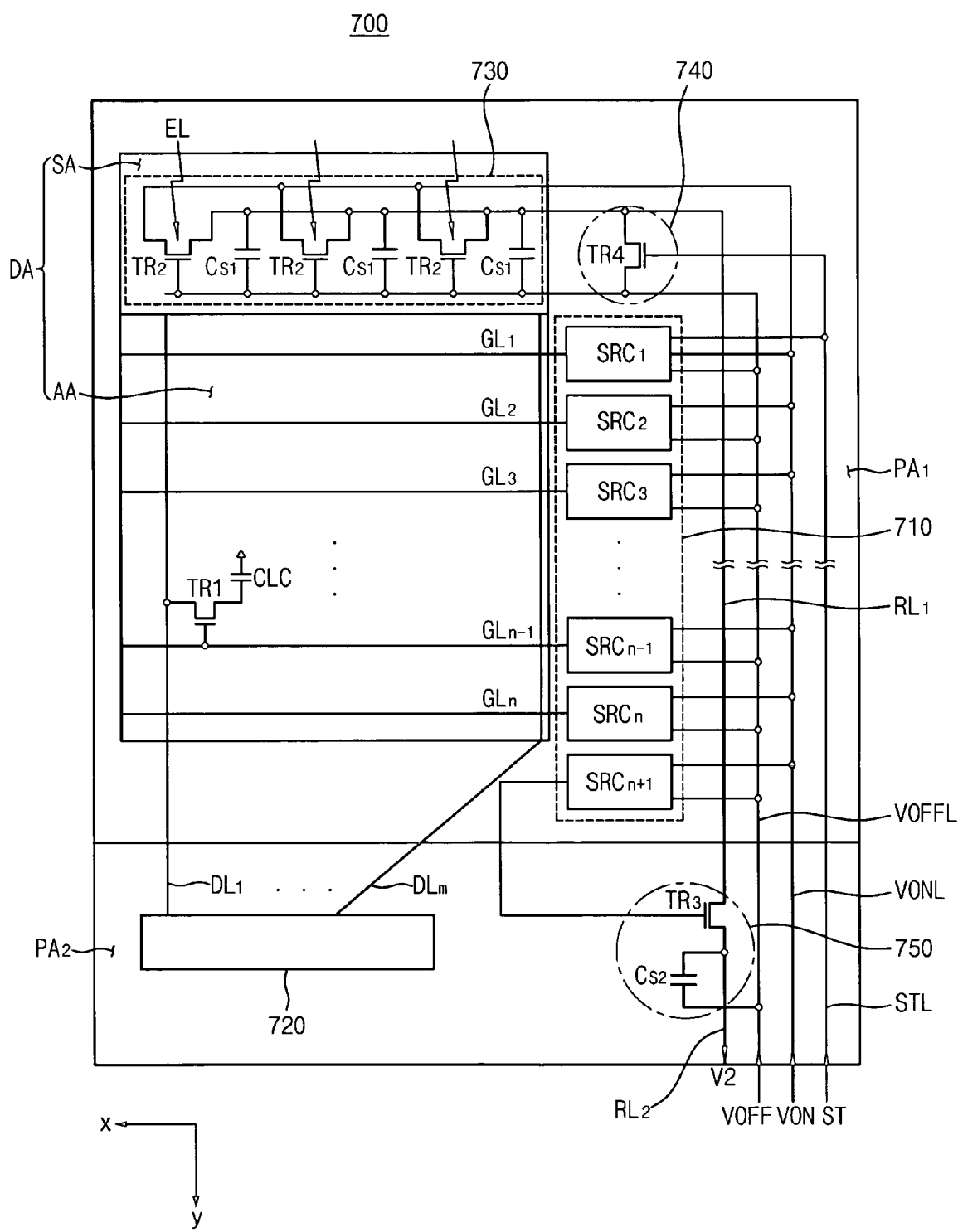
FIG. 16 is a schematic plan view illustrating a display device according to another exemplary embodiment of the present invention.

FIG. 16 is a schematic plan view illustrating a display device according to an exemplary embodiment of the present invention.

Referring to FIG. 16, a liquid crystal display device 700 includes a display panel having a display area DA for displaying images and first and second peripheral areas PA1 and PA2 adjacent to the display area DA. The display area DA includes an active area AA for displaying images and a light sensing area SA for sensing an intensity of external light EL. In the active area AA, switching elements TR1 are coupled to gate lines GL1 through GLn and data lines DL1 through DLm. In the light sensing area SA, a light sensor 730 including a light switching element TR2 for outputting a first voltage V1 (see FIG. 17) responsive to the intensity of the external light EL and a reset unit 740 for resetting the light sensor 730 are disposed.

A gate driver circuit 710 for outputting gate signals to the gate lines GL1 through GLn is disposed in the first peripheral area PA1. The gate driver circuit 710 may be implemented as a shift register including stages SRC1 through SRCn+1 that are sequentially connected to one another. The stages SRC through SRCn+1 of the shift register output gate signals to corresponding gate lines GL1 through GLn. The last stage SRCn+1 is a first dummy stage for driving an n-th stage SRCn.

In addition, a first driving voltage interconnection VONL to which a first driving voltage VON is applied and a second driving voltage interconnection VOFFL to which a second driving voltage VOFF is applied are formed near the gate driver circuit 710 in the first peripheral area PA1. Further, a scan start interconnection STL for providing a start signal ST to the first stage SRC1 is formed near the first driving voltage interconnection VONL in the first peripheral area PA1.

A data driver circuit 720 for outputting data signals to the data lines DL1 through DLm is disposed in the second peripheral area PA2. Additionally, a read out unit 750 is disposed in the second peripheral area PA2 to convert the first voltage V1 from the light sensor 730 into a second voltage V2.

Figure 17:
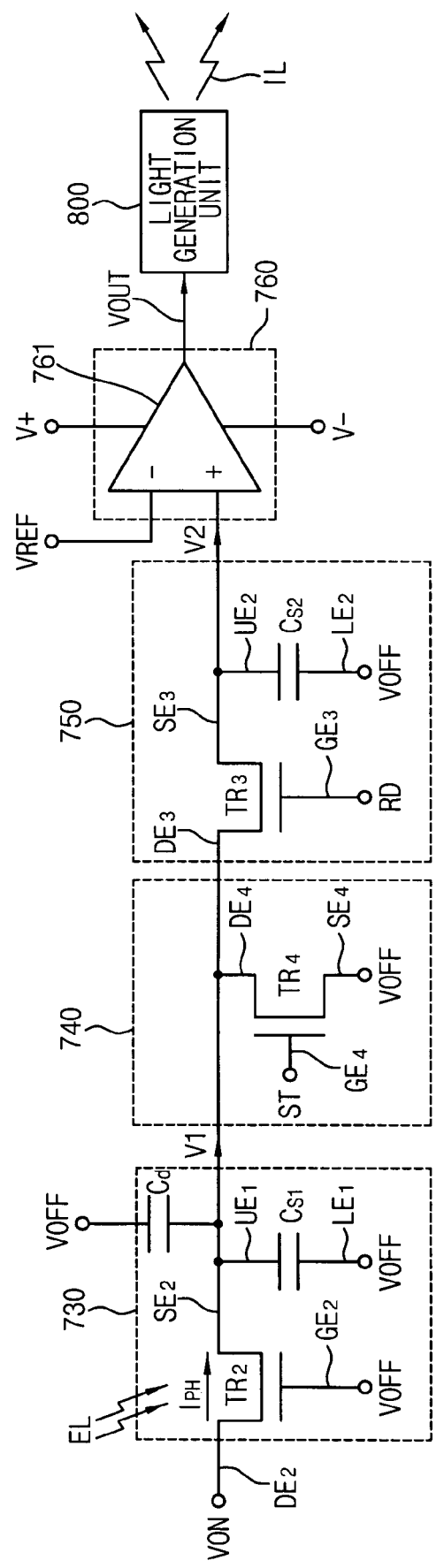
FIG. 17 is a circuit diagram illustrating an operation of a photo sensor in FIG. 16.

FIG. 17 is a circuit diagram illustrating an operation of the photo sensor in FIG. 16.

Referring to FIGS. 16 and 17, the liquid crystal display device 700 includes the light sensor 730, the reset unit 740, the read out unit 750, a driving controller 760 and a light generation unit 800.

The light sensor 730 includes the light switching element TR2 and a first storage capacitor CS1. The light switching element TR2 has a drain electrode DE2 electrically coupled to the first driving voltage interconnection VONL to receive the first driving voltage VON, a source electrode SE2 electrically coupled to the first storage capacitor CS1 and a gate electrode GE2 electrically coupled to the second driving voltage interconnection VOFFL to receive the second driving voltage VOFF.

The first storage capacitor CS1 includes a first electrode LE1 electrically coupled to the second driving voltage interconnection VOFFL and a second electrode UE1 coupled to a first read out interconnection RL1, wherein the first and second electrodes LE1 and UE1 are opposite to each other by interposing a gate insulation layer therebetween. The first storage capacitor CS1 is charged with the first voltage V1 corresponding to a light current IPH outputted from the light switching element TR2. The light sensor 730 further includes a drain capacitor Cd electrically coupled between the source electrode SE2 of the light switching element TR2 and the second driving voltage interconnection VOFFL.

The first read out interconnection RL1 is coupled to the first storage capacitor CS1 and the first voltage V1 charged in the first storage capacitor CS1 is read out through the first read out interconnection RL1.

The read out unit 750 includes a read out switching element TR3 and a second storage capacitor CS2. The read out switching element TR3 has a gate electrode GE3 for receiving a read out signal RD, a drain electrode DE3 electrically coupled to the first read out interconnection RL1 and a source electrode SE3 electrically coupled to the second storage capacitor CS2. When the read out switching element TR3 is turned on in response to the read out signal, the first voltage V1 provided from the first read out interconnection RL1 is transmitted to the read out switching element TR3 and converted into the second voltage V2.

The second storage capacitor CS2 includes a first electrode LE2 coupled to the second driving voltage interconnection VOFFL and a second electrode UE2 coupled to a second read out interconnection RL2, wherein the first and second electrodes LE2 and UE2 are opposite to each other by interposing the gate insulation layer therebetween. The second storage capacitor CS2 is charged with the second voltage V2 that is provided through the read out switching element TR3.

The reset unit 740 initiates the light generation unit 800 every predetermined period of time. The reset unit 740 includes a reset switching element TR4 having a gate electrode GE4 for receiving the start signal ST, a drain electrode DE4 electrically coupled to the first read out interconnection RL1 and a source electrode SE4 coupled to the second driving voltage interconnection VOFFL to receive the second driving voltage VOFF.

The reset switching element TR4 discharges the first storage capacitor CS1 to the second driving voltage VOFF through the second driving voltage interconnection VOFFL in response to the reset signal ST. Therefore, the reset switching element TR4 may periodically initiate or discharge the first storage capacitor CS1.

The driving controller 760 includes an operational amplifier (hereinafter, referred to as a comparator) 761 that is electrically coupled to the read out unit 750. The comparator 761 compares a predefined reference voltage VREF with the second voltage V2 outputted from the second read out interconnection RL2. The comparator 761 outputs a first control voltage V+ or a second control voltage V− in response to a comparison between the reference voltage VREF and the second voltage V2.

The light generation unit 800 is controlled responsive to an output voltage VOUT of the driving controller 760. For example, in response to the output voltage VOUT being the first control voltage V+, the light generation unit 800 prevents emission of an internal light IL. Additionally, in response to the output voltage VOUT being the second control voltage V−, the light generation unit 800 emits the internal light IL. Therefore, the internal light IL exiting from the liquid crystal display device 700 or a level of brightness is controlled responsive to the intensity of the external light EL to reduce power consumption.

As described above, according to exemplary embodiments of the present invention, a leakage current due to misalignment between first and second substrates of a photo sensor may be reduced to improve reliability of the photo sensor.

Having described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A photo sensor comprising:
a switching element disposed at a first substrate and defined by a control electrode, a first current electrode and a second current electrode, wherein the switching element includes a channel disposed between the first and second current electrodes, the channel having a first length to receive an incident external light, wherein the control electrode overlaps at least one portion of the first and second current electrodes to cover the channel and has a metallic material blocking light; and
a second substrate on which a light receiving unit is disposed at a position corresponding to the channel, wherein the light receiving unit has a second length longer than the first length and shorter than a third length of the control electrode.

2. The photo sensor of claim 1, wherein the switching element includes an amorphous silicon layer that is used for forming the channel.

3. The photo sensor of claim 1, wherein the second length of the light receiving unit extends beyond both ends of the channel to account for a misalignment between the first and second substrates.

4. The photo sensor of claim 3, wherein the second length of the light receiving unit is extended from both ends of the channel along a direction substantially perpendicular to a longitudinal direction of the first and second current electrodes by a first margin.

5. The photo sensor of claim 4, wherein the third length of the control electrode is extended from both ends of the light receiving unit in the direction substantially perpendicular to the longitudinal direction of the first and second current electrodes by a second margin that is greater than the first margin.

6. The photo sensor of claim 4, wherein the first margin is about 7 μm when the first length of the channel is about 4 μm.

7. The photo sensor of claim 5, wherein the second margin is about 10 μm when the first margin is about 7 μm.

8. The photo sensor of claim 1, wherein the light receiving unit includes sub sensor windows arranged to span a width of the channel.

9. The photo sensor of claim 8, wherein each of the sub sensor windows has a rectangular shape having a longer side corresponding to the second length.

10. The photo sensor of claim 8, wherein each of the sub sensor windows has a shape of an isosceles triangle having a height corresponding to the second length.

11. The photo sensor of claim 8, wherein each of the sub sensor windows has a shape of a right triangle having a height corresponding to the second length.

12. The photo sensor of claim 1, wherein the light receiving unit includes sub sensor windows arranged substantially parallel to the first length of the channel.

13. The photo sensor of claim 12, wherein each of the sub sensor windows has a rectangular shape having a longer side corresponding to a width of the channel.

14. The photo sensor of claim 12, wherein each of the sub sensor windows has a circular shape.

15. The photo sensor of claim 1, wherein the light receiving unit includes sub sensor windows arranged in a dot matrix pattern.

16. The photo sensor of claim 1, wherein the first and second current electrodes face each other and each of the first and second current electrodes is formed to have a shape of teeth of a comb.

* * * * *